United States Patent
Aksyuk et al.

(10) Patent No.: US 6,300,619 B1
(45) Date of Patent: Oct. 9, 2001

(54) MICRO-ELECTRO-MECHANICAL OPTICAL DEVICE

(75) Inventors: Vladimir Anatolyevich Aksyuk, Piscataway; David John Bishop, Summit; Cristian A. Bolle, North Plainfield; Randy Clinton Giles, Whippany; Flavio Pardo, New Providence, all of NJ (US)

(73) Assignees: Lucent Technologies Inc., Murray Hill, NJ (US); Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/415,178

(22) Filed: Oct. 8, 1999

Related U.S. Application Data

(63) Continuation-in-part of application No. 09/390,158, filed on Sep. 3, 1999, which is a continuation-in-part of application No. 08/997,175, filed on Dec. 22, 1997, now Pat. No. 5,994,159.

(51) Int. Cl.[7] .................................................. G02B 26/00
(52) U.S. Cl. ........................................... 250/216; 250/234
(58) Field of Search ..................................... 250/216, 234, 250/235, 236, 214 R; 33/568, 569, 570; 362/285, 286, 287, 288; 359/290, 291, 292; 428/88; 385/140; 438/50, 52

(56) References Cited

U.S. PATENT DOCUMENTS

| | | | |
|---|---|---|---|
| 5,658,636 | * 8/1997 | Reed et al. ............................. 428/88 |
| 5,903,380 | * 5/1999 | Motamedi et al. ................... 359/224 |
| 5,994,159 | * 11/1999 | Aksyuk et al. ......................... 438/52 |
| 6,116,756 | * 9/2000 | Peeters et al. ........................ 362/285 |
| 6,137,623 | * 10/2000 | Roberson et al. .................... 359/291 |
| 6,137,941 | * 10/2000 | Robinson ............................. 385/140 |

OTHER PUBLICATIONS

Chen et al., *IEEE*, "A Low Voltage Micromachined Optical Switch by Stress–Induced Bending," pp. 424–428, 1999.*

Cowan et al., *SPIE*, "Vertical Thermal Actuators for Micro–Opto–Electro–Mechanical Systems," vol. 3226, pp. 137–146, 1999.*

* cited by examiner

*Primary Examiner*—John R. Lee

(57) ABSTRACT

A micro-electro-mechanical (MEM) optical device having a reduced footprint for increasing yield on a substrate. The MEM device includes an optical element having an outer edge and supported by a support structure disposed on a substrate. The support structure is mechanically connected to the substrate through first and second pairs of beams which move the structure to an active position for elevating the optic device above the substrate. When in an elevated position, the optical device can be selectively tilted for deflecting optic signals. The beams are connected at one end to the support structure, at the other end to the substrate and are disposed so that the first and second beam ends are located proximate the optical device outer edge. In a preferred embodiment, a stiction force reducing element is included on the outer edge of the optical device for reducing the contact area between the optic device edge and the substrate.

11 Claims, 9 Drawing Sheets

MICRO-ELECTRO-MECHANICAL OPTICAL DEVICE

RELATED APPLICATIONS

This application is a continuation-in-part of application Ser. No. 09/390,158 filed on Sep. 3, 1999, still pending which is a continuation-in-part of application Ser. No. 08/997,175 filed on Dec. 22, 1997, now U.S. Pat. No. 5,994,159.

BACKGROUND OF THE INVENTION

1. Field of the Invention

The present invention relates generally to optical communication systems and, more particularly, to micro-electro-mechanical optical devices.

2. Description of the Related Art

Optical communication systems typically include a variety of optical devices (e. g., light sources, photodetectors, switches, attenuators, mirrors, amplifiers, and filters). The optical devices transmit optical signals in the optical communications systems. Some optical devices are coupled to electro-mechanical structures (e. g., thermal actuators) forming an electro-mechanical optical device. The term electro-mechanical structure as used in this disclosure refers to a structure which moves mechanically under the control of an electrical signal.

Some electro-mechanical structures move the optical devices from a predetermined first position to a predetermined second position. Cowan, William D., et al., "Vertical Thermal Actuators for Micro-Opto-Electro-Mechanical Systems", SPIE, Vol. 3226, pp. 137–146 (1997), describes one such electro-mechanical structure useful for moving optical devices from predetermined first positions to predetermined second positions.

In Cowan et al., the electro-mechanical structure is a thermal actuator. The thermal actuator is coupled to an optical mirror. Both the thermal actuator and the optical mirror are disposed on a surface of a substrate. The thermal actuator has two beams. A first end of each beam is coupled to the optical mirror. A second end of each beam is attached to the substrate surface.

Each beam of the thermal actuator has two material layers stacked one upon the other. The stacked material layers each have a different coefficient of thermal expansion, with the topmost material layer of each beam having a coefficient of thermal expansion larger than that of the other material layer.

The thermal actuator mechanically moves the optical mirror in response to an electrical signal being applied to the beams. Applying the electrical signal to the beams heats the stacked material layers. Thereafter, upon removal of the electrical signal, the stacked material layers cool. Since the topmost layer of each beam has the larger coefficient of thermal expansion, it contracts faster than the underlying material layer when cooled. As the topmost material layer contracts, it lifts the first end of each beam as well as the optical mirror coupled thereto a predetermined height above the plane of the substrate surface. Additional heating and cooling of the beams does not change the height of the optical device with respect to the plane of the substrate surface. As such, the usefulness of thermal actuators is limited to one-time setup or positioning applications.

Thus, electro-mechanical structures suitable for controlling the movement of optical devices continue to be sought.

SUMMARY OF THE INVENTION

A micro-electro-mechanical (MEM) optical device having a reduced footprint is disclosed. The MEM optical device is disposed on a substrate and includes a support structure for supporting an optical element having an outer edge. The optical element is used to deflect light at a selected angle based upon an amount of tilt imparted to the optical element. The support structure is supported by first and second pairs of beams connected at a first end to the support structure and fixed at a second end to the substrate. The beam pairs are arranged, relative to the optical device, so that the first and second ends of each beam are disposed in close proximity to the optical device. This reduces the amount of substrate surface area required for supporting the MEM optical device. As such, an array having an increased number and yield of devices can be produced in a given substrate size.

In a preferred embodiment, the second ends of the beams in each beam pair are located in close proximity to each other to provide for efficient electrical connection of activation leads to the beams, thereby reducing the amount of substrate surface area required for mapping the leads to the beams.

In another preferred embodiment a stiction force reduction element is included on the optical element as well as on an inner frame used for supporting the optical element. The stiction force reduction element is configured as a plurality of protrusions radially disposed on an outer edge of the optical element and on an outer edge of the inner frame for reducing a region of contact between the substrate and either or both of the inner frame and optical element.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference numerals denote similar elements throughout the views.

DETAILED DESCRIPTION OF THE PRESENTLY PREFERRED EMBODIMENTS

Figure 1:
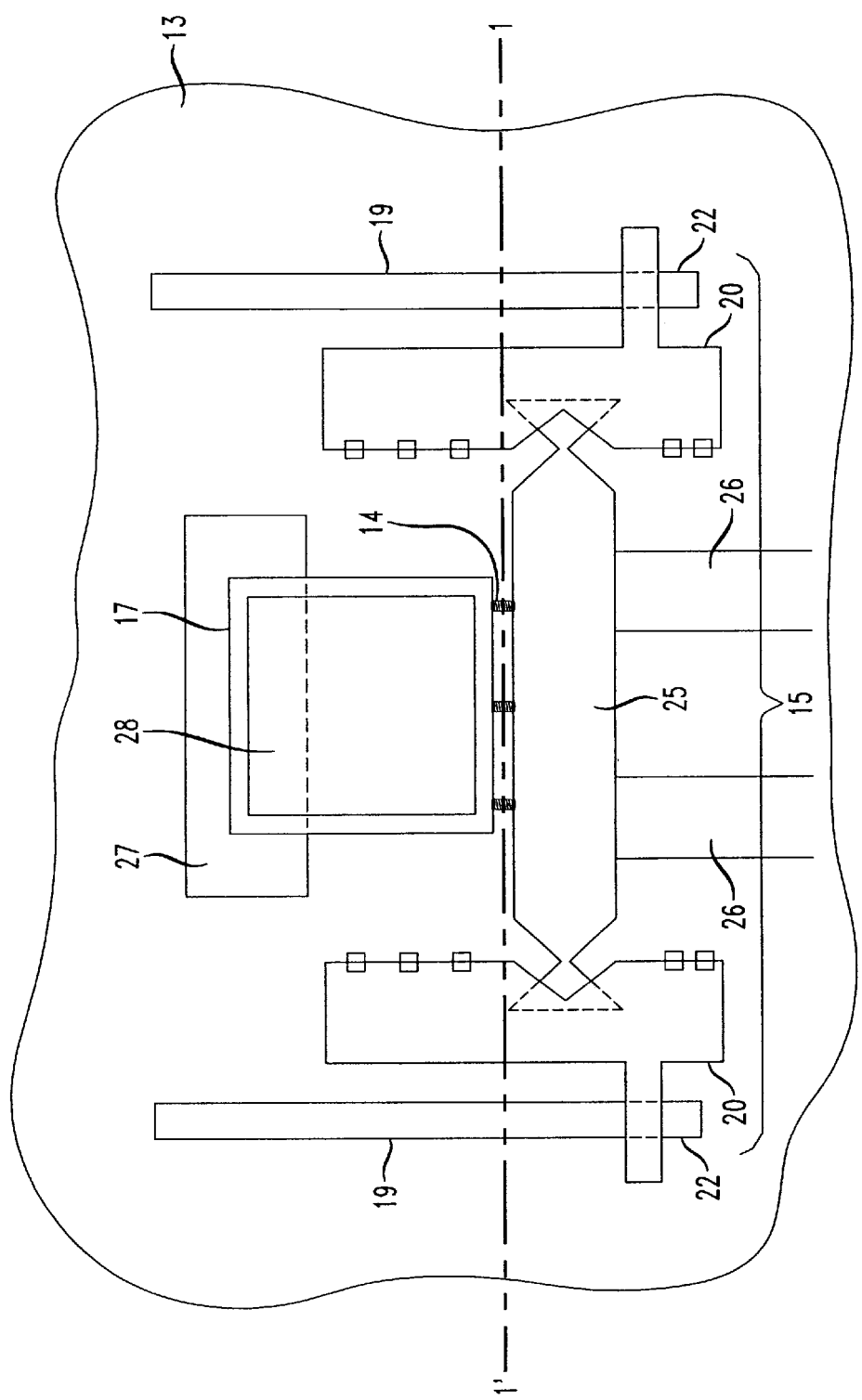
FIG. 1 depicts a top view of a substrate having a micro-electro-mechanical optical device of the present invention disposed on a surface thereof including an optical device coupled to a micro-electro-mechanical structure.

The present invention is directed to a micro-electro-mechanical optical device suitable for use in optical communication systems. Referring to FIG. 1, the micro-electro-mechanical optical device includes a micro-electro-mechanical structure 15 and an optical device 17 disposed on a surface of a substrate 13. The micro-electro-mechanical structure 15 is coupled to the optical device 17. For example, micro-electro-mechanical structure 15 is coupled to the optical device 17 with springs 14.

The electro-mechanical structure 15 includes a plurality of beams 19, 26. A first end 22 of beams 19 is coupled to a plate 20 in hinged attachment with the substrate surface 13. The hinged plate includes a v-shaped notch. The hinged plate 20 is coupled to an engagement plate 25. The engagement plate 25 is also coupled with the optical device 17. A first end of beams 26 is coupled to the engagement plate 25. A second end of beams 26 is coupled to the substrate surface 13. When unassembled the beams 19, 26, the hinged plate 20, and the engagement plate 25 lie flat on the substrate surface 13.

The engagement plate 25 has a pair of v-shaped notches located at opposite ends thereof. Each pair of v-shaped notches on the engagement plate 25 is located within the region of the v-shaped notch on the hinged plate 20.

Figure 2:
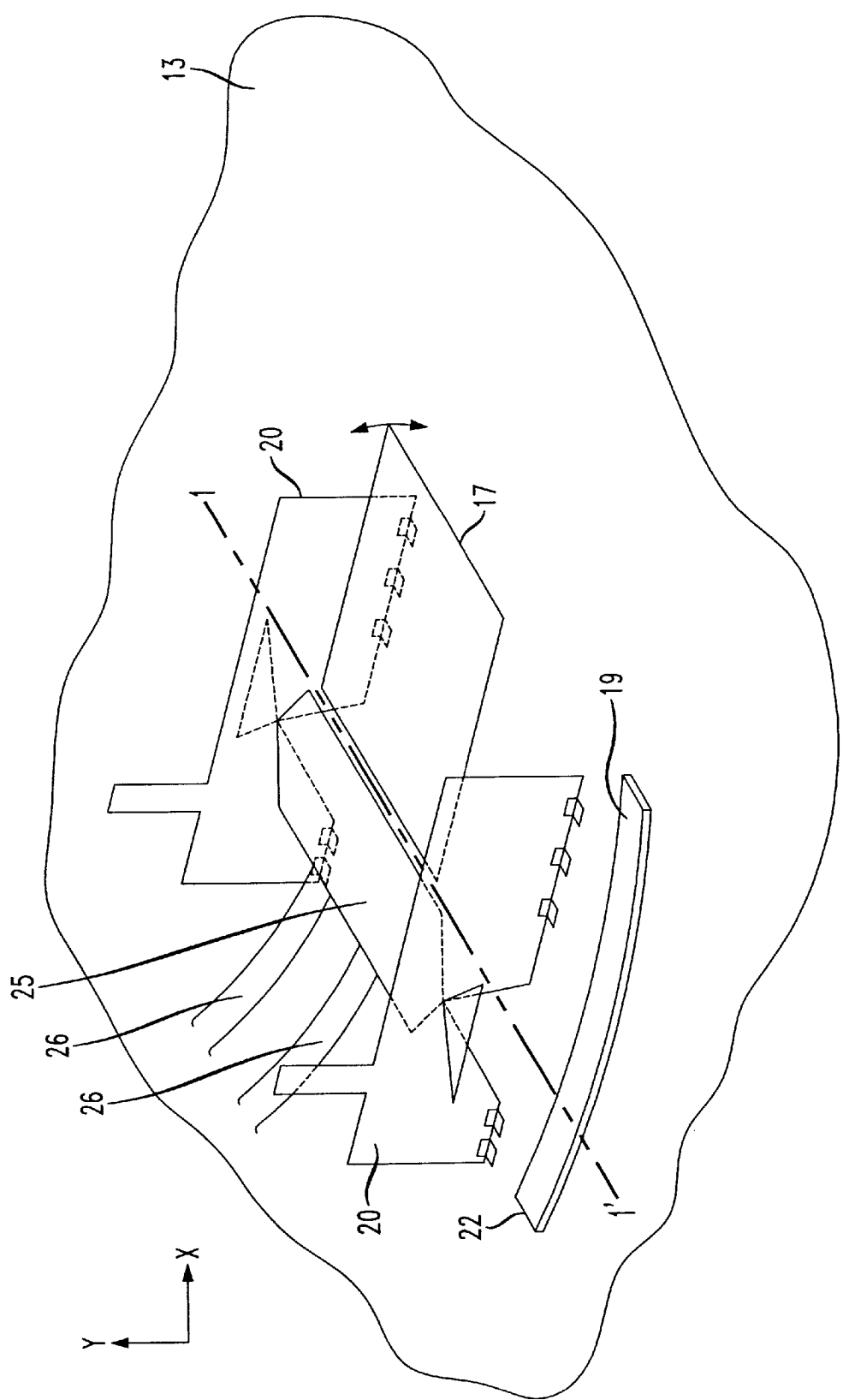
FIG. 2 is a side view of the micro-electro-mechanical optical device of FIG. 1 after the optical device is lifted above the plane of the substrate surface by the micro-electro-mechanical structure.

Referring to FIG. 2, the first ends 22 of the beams 19 lift in an upward direction, substantially in an arc, above the plane of the substrate surface in response to the application of an activation force. As the first ends 22 of the beams 19 are lifted above the plane of the substrate surface, they rotate the hinged plates 20 out of the plane of the substrate.

When the hinged plates 20 are rotated out of the plane of the substrate, the beams 26 lift the engagement plate 25 as well as the optical device above the plane of the substrate. As the engagement plate is lifted above the plane of the substrate, the pair of v-shaped notches on the engagement plate 25 slide into the v-shaped notch on the hinged plate 20. When the engagement plate 25 is lifted, it completes the rotation of the hinged plate 20 started by the beams 19 so that the hinged plates are about ninety degrees out of the plane of the substrate. The height of the v-shaped notch on the hinged plate 20 limits the height to which the optical device is lifted and holds it in a fixed, well-defined position.

Figure 3:
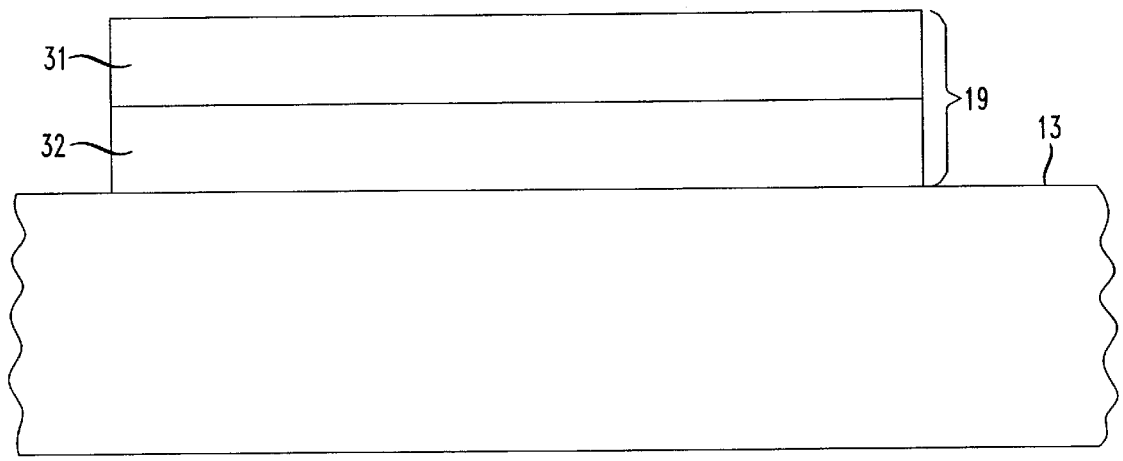
FIG. 3 is a cross-sectional view of one configuration for a beam before an activation force is applied thereto.

A variety of activation forces can be applied to the electro-mechanical structure to lift the first ends 22 of the beams. Referring to FIG. 3, when the activation force applied to the electro-mechanical structure is based on thermal contraction of the beams, each beam 19, 26 includes two or more material layers 31, 32 stacked one upon the other. The stacked material layers 31, 32 each have a different coefficient of thermal expansion.

In one embodiment, the topmost material layer 31 of each beam 19, 26 has a coefficient of thermal expansion larger than that of the other material layer 32.

Figure 4:
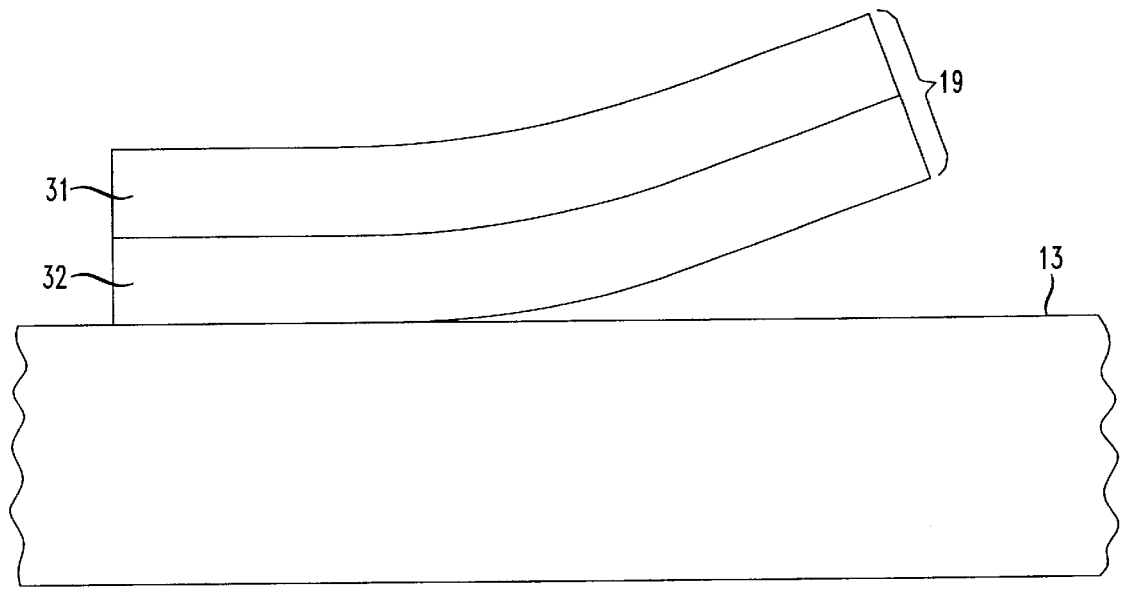
FIG. 4 is a cross-sectional view of the beam of FIG. 3 after the activation force has been applied thereto.

Applying a current to the beams 19, 26 heats the stacked material layers 31, 32. The current is applied to the beams 19, 26 from a current source (not shown). Referring to FIG. 4, when the stacked material layers 31, 32 are heated they curl up, lifting the first end of each beam 19, 26 as well as the optical mirror (not shown) coupled thereto out of the plane of the substrate surface 13. The height that the end of each beam lifts out of the plane of the substrate surface depends on the length of the beams as well as the composition of the material layers used to form the beams. However, the height that the end of each beam 26 lifts out of the plane of the substrate surface is preferably sufficient to lift the engagement plate 25 and rotate the hinged plate about 90 degrees relative to the substrate surface.

Figure 5:
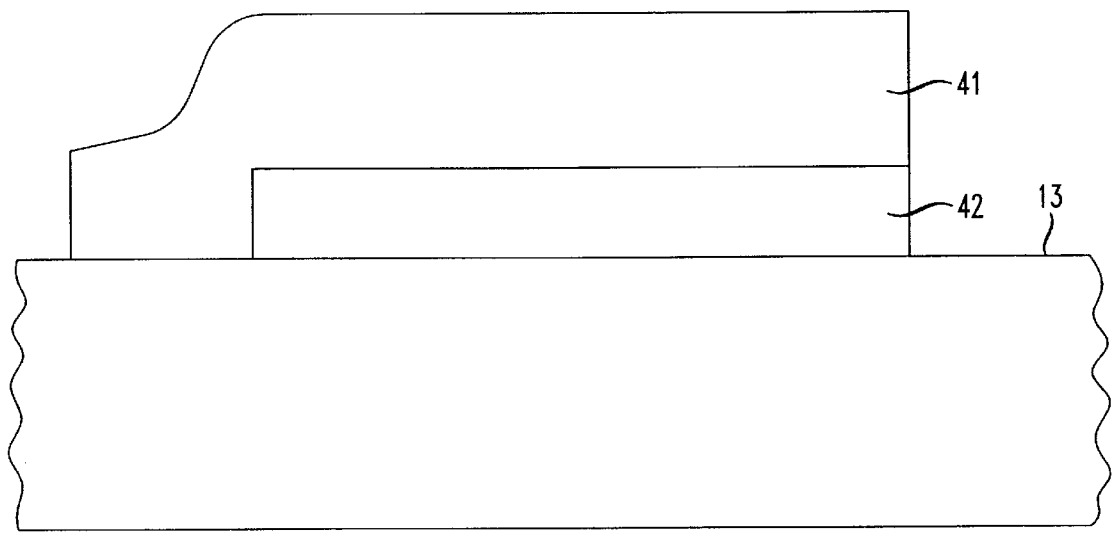
FIG. 5 is a cross-sectional view of an alternate configuration for the beams before an activation force is applied thereto.
Figure 6:
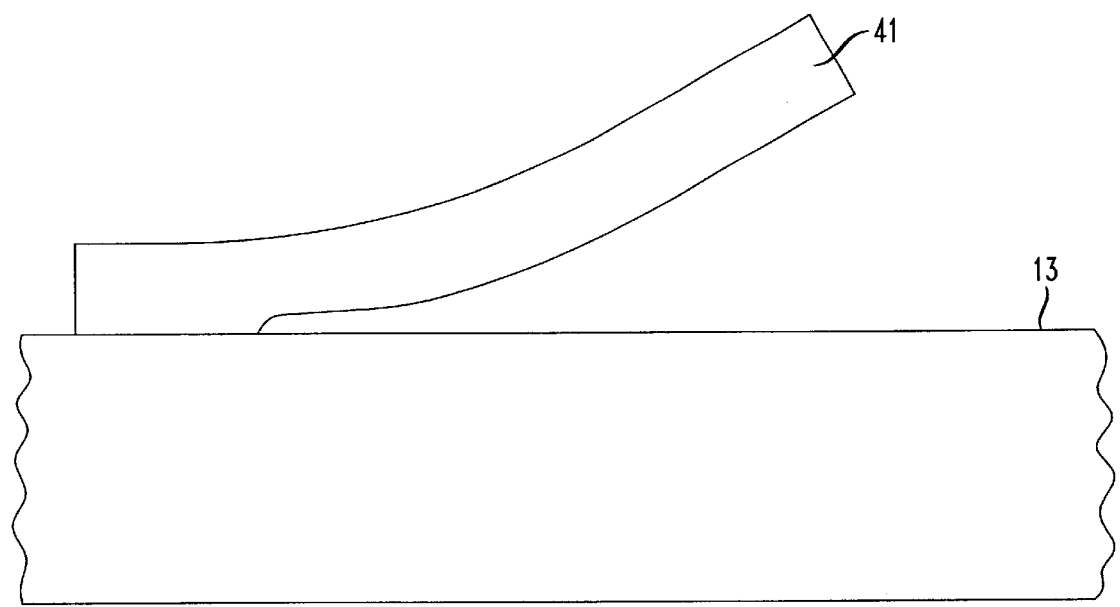
FIG. 6 is a cross-sectional view of the beam of FIG. 5 after the activation force has been applied thereto.

Alternatively, when the activation force applied to the electro-mechanical structure is based on beam contraction due to intrinsic stress, each beam 19, 26 includes two or more material layers 41, 42 stacked one upon the other on the substrate surface 13, as shown in FIG. 5. The topmost material layer 41 has an intrinsic stress. The topmost material layer optionally has a stress gradient therein. The bottom material layer 42 is a sacrificial layer.

When the sacrificial material layer 42 is removed (e. g., by etching), the two or more topmost layers 41 lift the first end of each beam 19, 26 as well as the hinged plate (not shown) coupled thereto above the plane of the substrate surface 13. The height that the end of each beam lifts out of the plane of the substrate surface depends on the length of the beams as well as the composition of the material layers used to form the beams. However, the height that each beam 26 lifts out of the plane of the substrate surface is preferably sufficient to lift the engagement plate 25 and rotate the hinged plate about 90 degrees relative to the substrate surface.

Other suitable activation forces include scratch drives, and electromagnetic forces. Illustrative electro-mechanical structures based on scratch drives are discussed in Akiyam, T. et al., "A Quantitative Analysis of Scratch Drive Actuator Using Buckling Motion", Proc. $8^{th}$ IEEE International MEMS Workshop, pp. 310–315 (1995) and electro-mechanical structures based on electromagnetic forces are discussed in Busch-Vishniac, I. J., "The Case for Magnetically Driven Microactuators", Sensors and Actuators A, A33, pp. 207–220 (1992).

After the electro-mechanical structure 15 lifts the optical device 17 above the plane of the substrate, the lifted optical device 17 is moveable in response to an electrostatic field generated between such optical device 17 and the substrate surface 13. The electrostatic field is generated by applying a bias voltage between the optical device 17 and the substrate surface 13.

Referring to FIGS. 1 and 2, when the electrostatic field is generated between the optical device 17 and the substrate 13 (or electrode 27), such electrostatic field can rotate such optical device 17 around an axis 1–1'. The angle that the optical device 17 is rotated around axis 1–1' depends on the magnitude of the electrostatic field generated between the optical device 17 and the substrate 13 (or electrode 27). The magnitude of the electrostatic field depends on the amount of the applied bias voltage.

Alternatively, the optical device can be made to deflect substantially towards the substrate or move using both rotation and deflection. Such motion depends on the electrode 27 geometry as well as the coupling between the optical device and the engagement plate.

Both the optical device and the substrate are preferably conductive so that the bias voltage may be applied across them to generate the electrostatic field. When either of the optical device or the substrate are insufficiently conductive to generate the electrostatic field, conductive layers (electrodes) 27, 28 are optionally formed on regions thereof as shown in FIG. 1.

The micro-electro-opto-mechanical device of the present invention is fabricated by providing a substrate that is suitably prepared (i.e., doped, as appropriate) and cleaned. Suitable substrate materials include silicon, gallium arsenide, indium phosphide, germanium or indium tin oxide (ITO) coated glass.

A plurality of material layers are formed in a planar arrangement on a surface of the substrate. Examples of suitable material layers include polysilicon, silicon nitride, and silicon dioxide.

After each layer of the plurality of material layers are formed on the substrate, each layer is patterned to form a micro-electro-mechanical structure as well as an optical device. For example, the electro-opto-mechanical device shown in FIG. 1, including a mirror 17 as well as beams 19, 26, is fabricated using a Multi-User MEMS Process (MUMPS) provided by the MCNC MEMS Technology Applications Center, MCNC, Research Triangle Park, North Carolina (see SmartMUMPs Design Handbook at mems.mcnc.org).

In the MUMPS process the micro-electro-mechanical structure and the optical mirror are formed in polysilicon layers, oxide layers (e.g., phosphosilicon glass) provide sacrificial layers, and silicon nitride electrically isolates the micro-electro-mechanical structure and optical mirror from the substrate. The micro-electro-mechanical structure and optical mirror are formed in the polysilicon layers with multiple photolithography steps.

Photolithography is a process which includes the coating of one or more of the polysilicon layers and phosphosilicon glass layers with a photoresist (i. e., an energy sensitive material), exposure of the photoresist with an appropriate mask, and developing of the exposed photoresist to create the desired etch mask for subsequent pattern transfer into the one or more underlying polysilicon layers and phosphosilicon glass layers. The pattern defined in the photoresist is transferred into the one or more underlying polysilicon layers and phosphosilicon glass layers by etching for example in a reactive ion etch (RIE) system.

The following example is provided to illustrate a specific embodiment of the present invention.

EXAMPLE 1

A micro-electro-mechanical optical device having the structure depicted in FIG. 1 was obtained from the MEMS Technology Application Center, MCNC, Research Triangle Park, North Carolina. The micro-electro-mechanical optical device was disposed on a surface of a silicon substrate. The silicon substrate had a resistivity of about 1–2 ohm-cm. A multi-layered planar arrangement of alternating polysilicon layers (POLY0, POLY1 and POLY 2) and phosphosilicon glass layers (OX1 and OX2), formed over a 600 nm (nanometer) thick silicon nitride layer, was formed on the silicon substrate.

The polysilicon layers POLY0, POLY1 and POLY 2 had thicknesses of about 0.5 $\mu$m (micrometers), 2.0 $\mu$m, and 1.5 $\mu$m, respectively. The phosphosilicon glass layers OX1 and OX2 had thicknesses of about 2 $\mu$m and 0.75 $\mu$m, respectively. A 0.5 $\mu$m layer of Cr/Au was formed on the POLY2 layer.

The silicon nitride layer, the polysilicon layers (POLY0, POLY1 and POLY2), the phosphosilicon glass layers (OX1 and OX2), and the Cr/Au layer were formed on the silicon substrate using low pressure evaporation techniques.

Referring to FIG. 1, the electro-mechanical structure 15 and the optical device 17 were defined in the multi-layered planar arrangement using photolithographic techniques. The electromechanical structure included two beams 19, 26 each coupled at one edge to a plate 20 in hinged attachment with the substrate. The beams 19 each had a width of about 50 $\mu$m and a length of about 300 $\mu$m. The beams 26 had a width of about 100 $\mu$m and a length of about 500 pim. The beams were defined in the POLY1 and POLY2 layers. Beams 19, 26 also had a Cr/Au layer deposited thereon to create intrinsic stresses, making them curl and move the structure.

The hinged plates 20 had a width of about 300 $\mu$m and a height of about 70 $\mu$m. The v-shaped notch had a notch height of about 50 $\mu$m. The hinged plates 20 were defined in the POLY2 and POLY1 layers.

The engagement plate 25 had a length of about 400 $\mu$m and a width of about 150 $\mu$m. Each v-shape notch had a notch height of about 70 $\mu$m. The engagement plate 25 was defined in the POLY1 and POLY2 layers.

The optical device was a mirror having dimensions of about 300 $\mu$m×300 $\mu$m. The optical device was defined in the POLY1, POLY2, and Cr/Au layers.

An edge of the optical device was coupled to the engagement plate with a spring 14. The spring is defined only in the POLY1 layer.

The electrodes 27 were about 300 $\mu$m long and about 200 $\mu$m wide and were formed using the POLY0 layer.

Each fabrication step mentioned above was performed at the MEMS Technology Application Center, MCNC, Research Triangle Park, North Carolina.

After the electro-mechanical structure and the optical device were defined in the POLY0, POLY1, POLY2, OX1, OX2, and Cr/Au layers, the electro-mechanical structure and the optical device were released from the surface of the silicon substrate by etching the phosphosilicon glass layers in a bath of 49% HF at room temperature for about 1–2 minutes.

When the phosphosilicon glass layers were then removed, the beams rotated the hinged plate and lifted the engagement plate as well as the optical device off of the substrate surface. The optical device was lifted to a height of about 50 $\mu$m above the substrate surface.

A voltage of about 100 V was applied between the optical device and pad 27 on the substrate surface. After the voltage was applied between the optical device and pad 27, the optical device pivoted about axis 1–1' (FIG. 1), so that the optical device was at an angle of about 5° with respect to the substrate surface.

The micro-electro-mechanical optical device 12 is typically produced in bulk on a common substrate 13 and may be used, for example, in a wavelength routing device for directing multiple wavelengths among various optical fibers and devices. For such use, the multiple devices 12 are arranged in an array 80 on the substrate 13, as for example shown in FIG. 9. As discussed above, each device 12 includes the micro-electro-mechanical structure 15 and the optical device 17 and is operated and maneuvered by applying appropriate electrical signals through electrodes 50 for activating the beams 19, 26 and elevating the optical device 17 away from the substrate 13. Springs 30 and electrodes 50, 52 are then used to provide tilt to the optical devices 17 with respect to the plane containing the substrate 13. In this manner, an array 80 of optical devices 17 can receive multiple optical channels from, for example, a demultiplexed signal provided on an optic fiber, and deflect each optical signal to a distinct output optic-fiber through angular displacement and adjustment of the individual optical devices 17.

Figure 7:
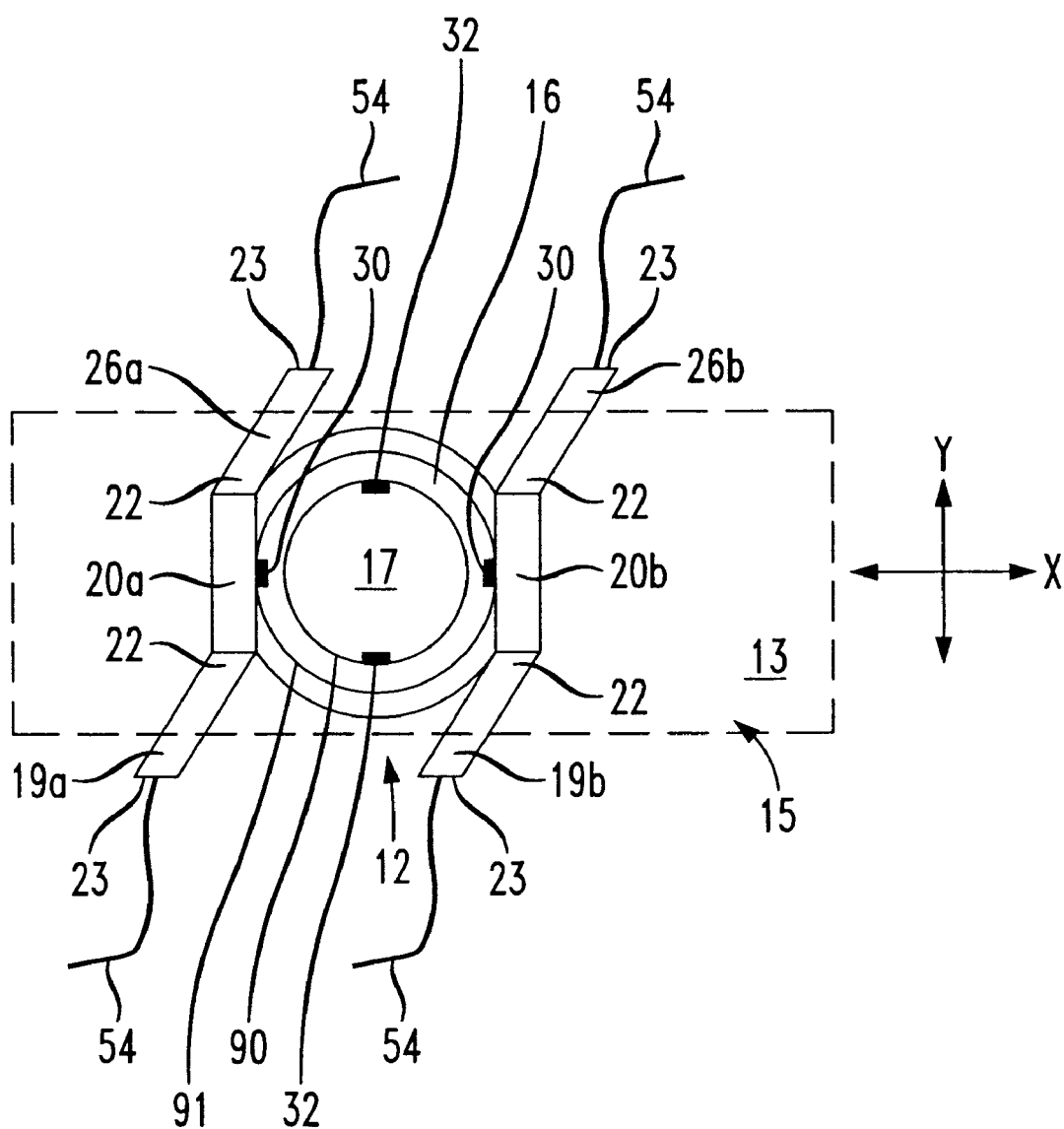
FIG. 7 is a top view of another embodiment of a ficro-electro-mechanical optical device in accordance with the invention.

With reference now to FIG. 7, a preferred embodiment of the micro-electro-mechanical device 12 supported by structure 15 is depicted. Structure 15 has two pairs of beams 19 and 26, with each beam connected at its respective end 22 to a different plate 20 relative to the other beam in the corresponding pair. For example, plate 20a is moveable to an engagement position for raising device 17 out of the plane of the substrate 13 by beams 19a and 26a connected at their ends 22 to plate 20a. Similarly, plate 20b is moveable via the beams 19b and 26b connected thereto. The remaining beam ends 23 are fixed to substrate 13 and provide leverage for raising optical device 17. As explained in detail above, the beams are activated by applying electrical signals thereto, such as through a plurality of activation leads 54. For increased mobility and angular displacement or tilt, structure 15 includes an inner frame 16 having an outer edge 91. Frame 16 is pivotally secured to plates 20a, 20b by springs 30 to provide for tilt of frame 16 along an axis parallel to directional axis X. A second pair of springs 32 pivotally connects optical device 17 to the inner frame 16 to provide tilt of device 17 about an axis parallel to directional axis Y.

Figure 9:
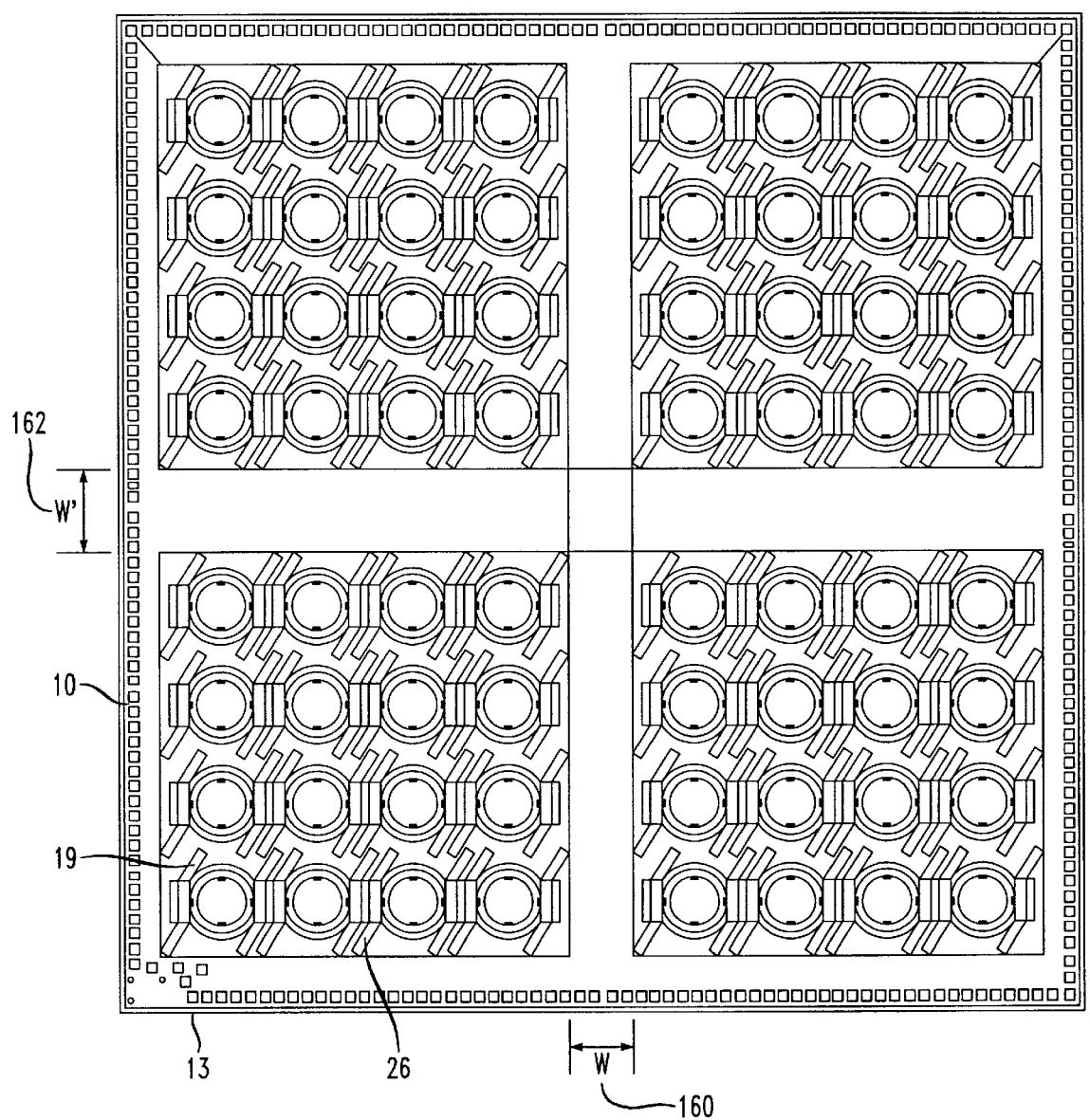
FIG. 9 depicts an array of micro-electro-mechanical optical devices made up of the devices of FIG. 7.

When an array of devices 12 are formed on a common substrate, as shown in FIG. 9, the beam arrangement of the device 12 shown in FIG. 7 limits the distance between adjacent devices because a fixed amount of substrate surface area is required to accommodate the beam pairs 19 and 26. In addition, since the substrate-fixed ends 23 of the beams in each pair are distally located from each other for a subject structure 15 (e.g., the ends 23 of beams 19a and 19b), the activation leads 54 are, likewise, distally spaced. To activate the beams, leads 54 must be gathered and provided to an edge of the substrate so that electrical signals can be applied thereto. Such an arrangement dictates the need for spaces or arteries 160, 162 formed on substrate 13 to accommodate mapping of the activation leads 54 to a location, such as at or proximate an edge of substrate 13, where the signals can be applied to such leads. The arteries 160, 162 shown in the micro-electro-mechanical optical device array of FIG. 9 are configured as rectangular regions having widths w and w', respectively, which divide the array into four separate regions.

The need for arteries 160, 162 to accommodate mapping of the activation leads 54, which is dictated by the layout or arrangement of the beam pairs 19, 26, reduces the amount of substrate surface area available for supporting additional devices 12. Thus, and in accordance with another embodiment of the present invention, a modified micro-electro-mechanical optical device 112 having a form-fitting beam structure is provided and shown in FIG. 8. Device 112, like the device 12 described above, is formed on a substrate 113 and includes a micro-electro-mechanical structure 150 for supporting and elevating an optical device 117 away from the substrate. For illustrative variation, optical device 117 is shown having an oval shape as opposed to the round shape of FIG. 7 or the square shape of FIG. 1. It will nevertheless be understood that any shape for device 117 can be used without departing from the intended scope and contemplation of the present invention.

Figure 8:
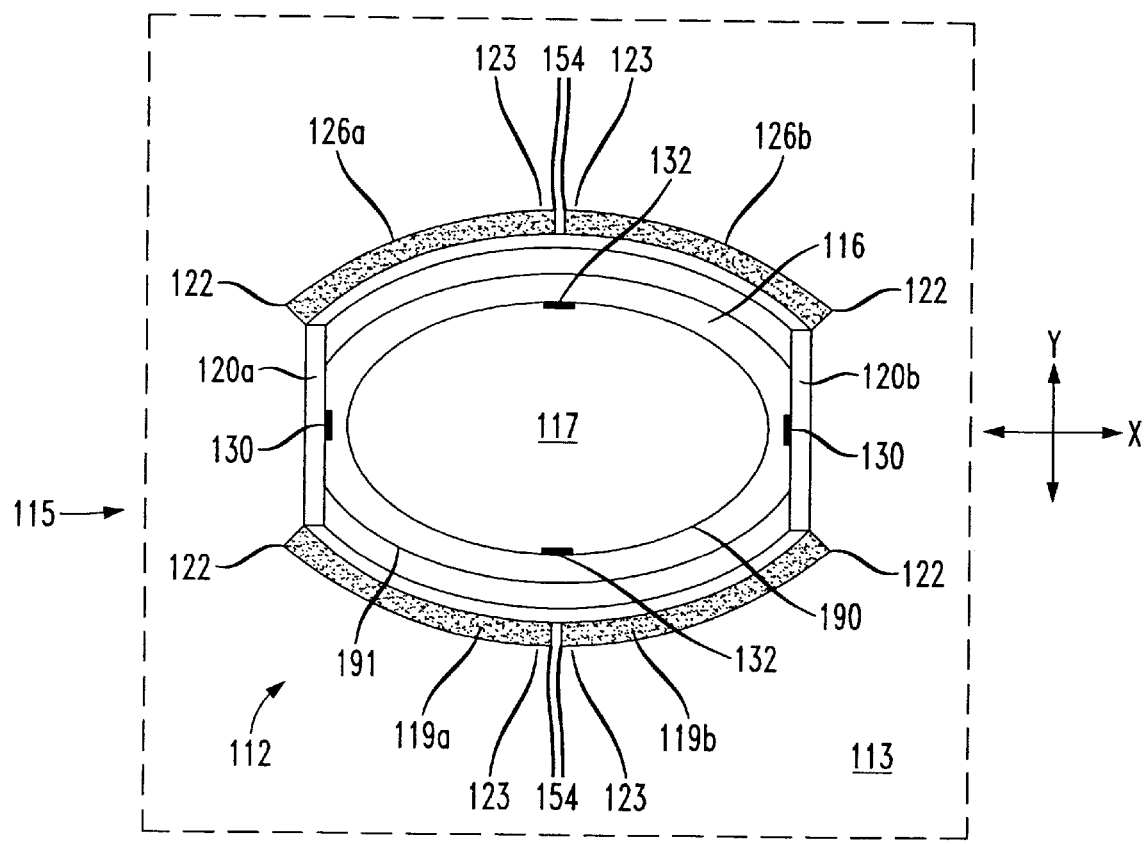
FIG. 8 is a top view of yet another embodiment of a micro-electro-mechanical optical device in accordance with the present invention.

A primary difference between the structure 15 of FIG. 7 and the structure 115 of FIG. 8 lies in the configuration and arrangement of the beams 119 and 126. In the embodiment of FIG. 8, beams 119 and 126 are disposed relative to the optic device 117 so that both ends of each beam (i.e. ends 122, 123) are located proximate to the optic device 117. In other words, both ends are located proximate to an outer edge 190 of the device 117. This is contrary to the beam arrangement of FIG. 7 wherein only the first beam ends 22 are located proximate outer edge 90 of optic device 17. The form-fitting beam arrangement of FIG. 8 includes two pairs of form-fitting beams, namely a first pair formed of beams 119a, 119b and a second pair formed of beams 126a, 126b, with each beam being connected at a first end 122 to an end of a respective plate 120a, 120b for rotating the plates and elevating the optic device 117, as discussed above. The second ends 123 of each beam in each beam pair are fixed to substrate 113 and are positioned in close proximity to the outer edge 190 of optical device 117. The second ends 123 of the beams in each pair (e.g., beams 119a, 119b) are also, preferably, positioned proximate to each other as shown. This form-fitting beam arrangement results in an advantageous reduction in the overall footprint or occupied substrate area for the modified micro-electro-mechanical device 112.

Figure 10:
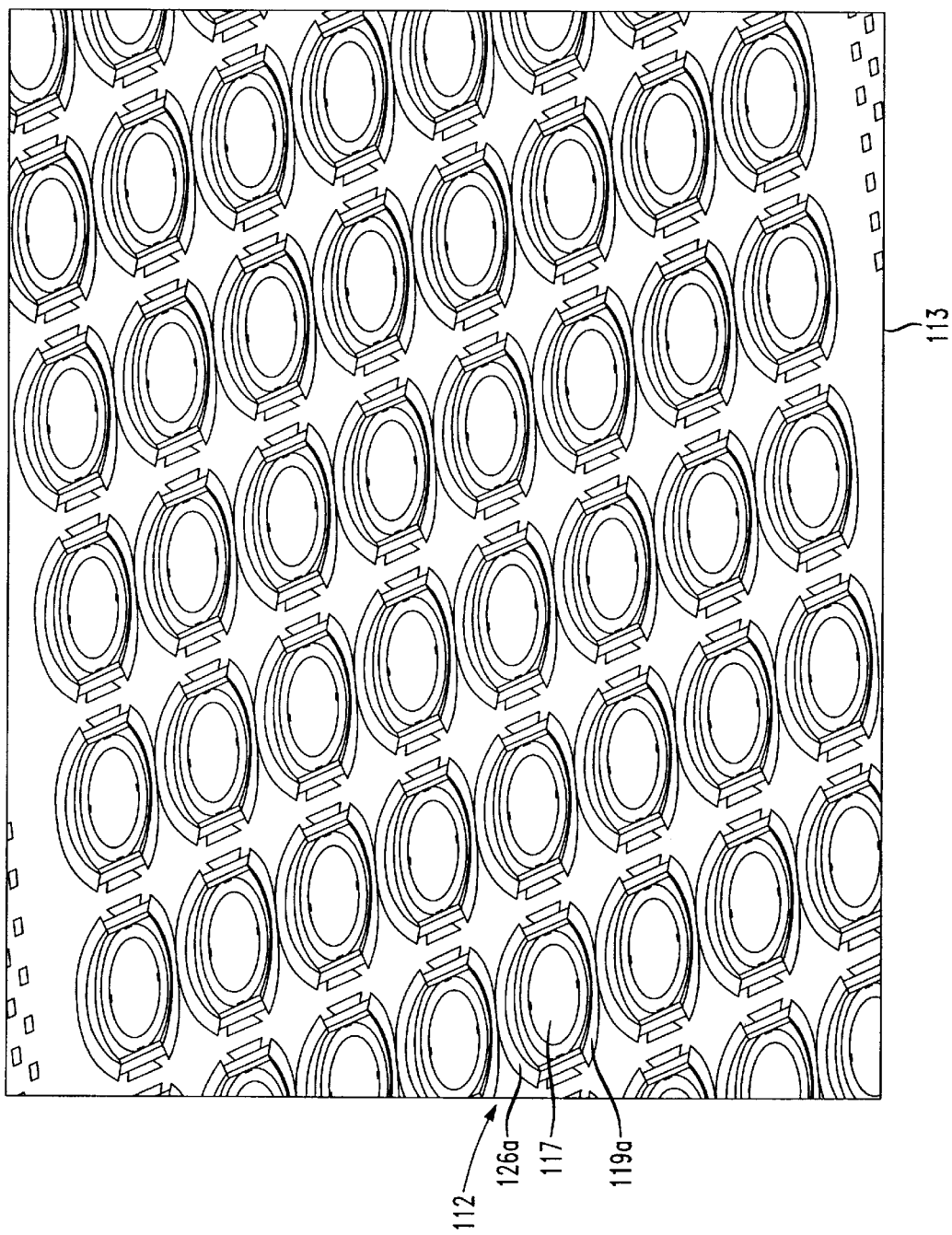
FIG. 10 depicts an array of micro-electro-mechanical optical devices made up of the devices of FIG. 8.

With reference now to FIG. 10, an array of the form-fitting micro-electro-mechanical optical devices is there depicted. As shown, the array includes a plurality of devices 112 employing the form-fitting beam arrangement of FIG. 8. The locations of the beam ends 123 for each beam pair 119, 126 allow for a more economical layout of the individual devices 112 and mapping arrangement for the activation leads 154. As a result, the need for the arteries 160, 162 shown in FIG. 9 is eliminated and the physical separation between adjacent devices 112 is reduced as compared to the necessary separation between adjacent devices in the array of FIG. 9. This, as will be appreciated, allows for an increase in the number of devices 112 accommodated by a single substrate 113.

During operation of device 112, a signal may be applied to one or both spring pairs 130, 132 to cause tilt of the inner frame 116 and/or optic element 117. The amount of tilt is proportional to the strength of the signal applied to the springs. For a signal of particular strength, the outer edge 191 of the inner frame 116 or the outer edge 90 of the optic device may come into contact with the surface of substrate 113. When this occurs, an attraction or stiction force between the substrate and frame edge 91 or between the substrate and optic device edge 90 will retard or obstruct further movement of the frame or optic element, such as when the optic element 117 is to be moved back or returned to a horizontal position relative to the substrate 113.

Figure 11:
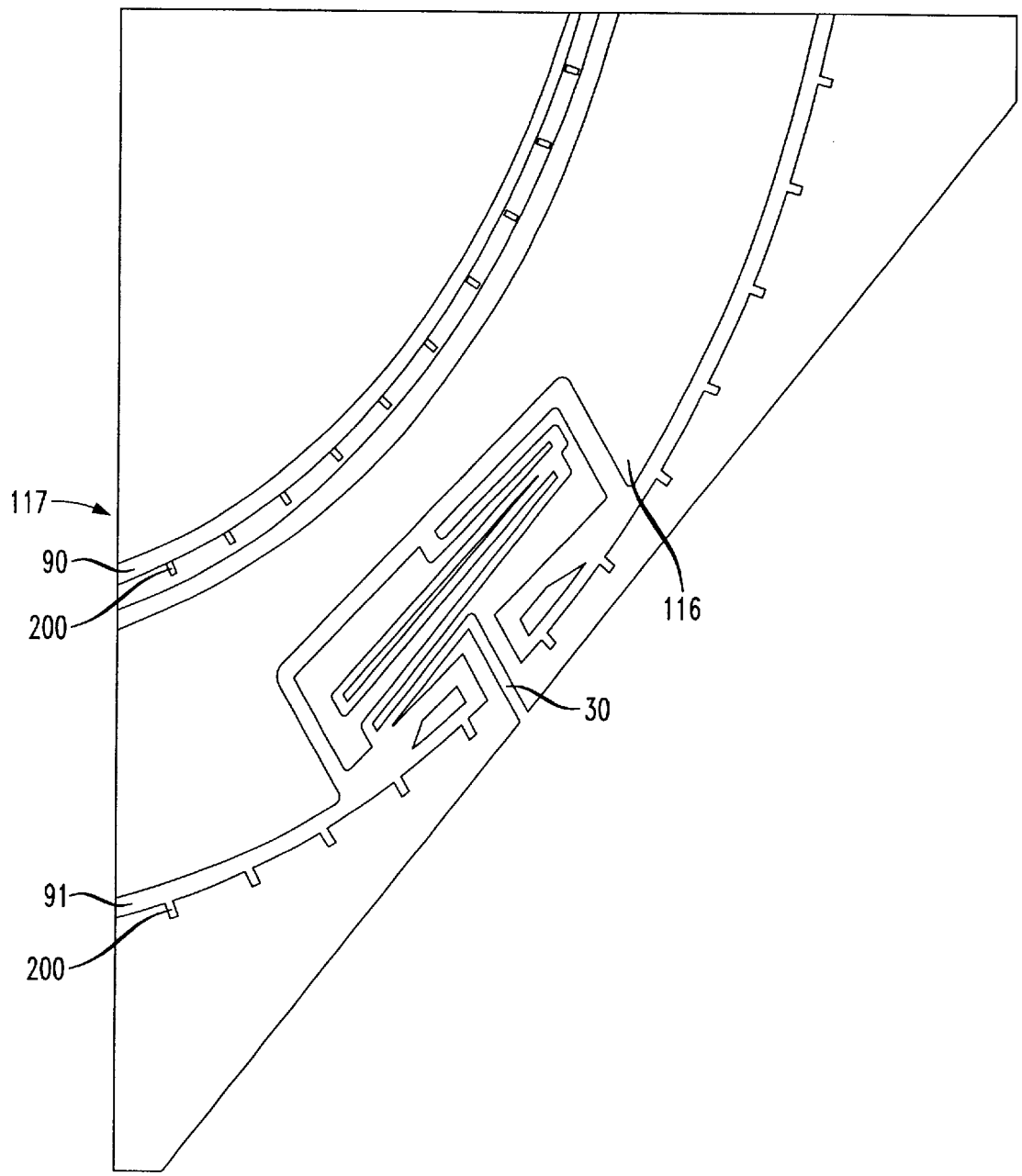
FIG. 11 is a sectional, magnified view of the micro-electro-mechanical optical device of FIG. 8 depicting an additional feature of the present invention.

It has been discovered that the level or amount of stiction force present between two items is related to the amount of surface area in contact between the two items. Using this discovery, a preferred embodiment of the present invention includes a contouring element for limiting the contact surface area between the substrate and the outer edges of the inner frame and/or the optic device 117. This feature is shown in FIG. 11, which depicts a section of the optic device 117 and inner support 116. As shown, the leading edge 90 of the optic device 117 includes a plurality of radially-spaced protrusions or fingers 200 which extend outward away from the device 117. The leading edge 91 of inner frame 116 also includes a plurality of protrusions radially arranged and oriented in a direction away from the inner frame 116. When either the inner frame edge 91 or the optic element edge 90 comes into contact with substrate 113, the region of contact is reduced and occurs only between the substrate and the tips of the protrusions 200. This minimizes the stiction force and provides for increased maneuverability of the micro-electro-mechanical structures 115.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A micro-electro-mechanical optical device, comprising:
   a substrate having a surface area;
   an optical element having an outer edge for deflecting an optical signal received by said optical element; and
   a micro-electro-mechanical structure supported on said substrate surface and mechanically connected to said optical element and operable for moving said optical element from a quiescent position to an elevated position above said substrate surface, said structure having a first engagement plate and a first pair of beams for imparting motion to said engagement plate and elevating said optical element, said plate being connected to a first end of one of said beams in said first beam pair, and a second end of said beams in said beam pair being connected to said substrate surface, said beams being arranged on said substrate surface so that said first and second ends are positioned proximate said outer edge of said optical device.

2. The micro-electro-mechanical optical device of claim 1, further comprising a second engagement plate and a second pair of beams for imparting motion to said second engagement plate and elevating said optical element, said second plate being connected to a first end of one of said beams in said second beam pair, and a second end of said beams in said second beam pair being connected to said substrate surface, said beams in said second beam pair being arranged on said substrate surface so that said first and second ends of said second beam pair are positioned proximate said outer edge of said optical device.

3. The micro-electro-mechanical optical device of claim 2, wherein said second ends of said first beam pair are disposed on said substrate surface proximate each other and wherein said second ends of said second beam pair are disposed on said substrate surface proximate each other.

4. The micro-electro-mechanical optical device of claim 2, wherein said outer edge of said optical element is curved and wherein the beams of said beam pairs are curved.

5. The micro-electro-mechanical optical device of claim 1, further comprising an inner support having an edge for interfacing said optical element with said micro-electro-mechanical structure.

6. The micro-electro-mechanical optical device of claim 1, further comprising a stiction force reducing element disposed on said outer edge of said optical element.

7. The micro-electro-mechanical optical device of claim 6, wherein said stiction force reducing element comprises a plurality of protrusions extending outwardly from and radially spaced about said outer edge of said optical element.

8. The micro-electro-mechanical optical device of claim 2, further comprising an inner support having an edge for interfacing said optical element with said micro-electro-mechanical structure, a first stiction force reducing element disposed on said outer edge of said optical element, and a second stiction force reducing element disposed on said outer edge of said inner support.

9. A micro-electro-mechanical optical device, comprising:
   a substrate having an optical device and a micro-electro-mechanical structure disposed on a surface thereof, said optical element having an outer edge, wherein the optical device is supported by said micro-electro-mechanical structure, wherein the micro-electro-mechanical structure is operable to lift the optical device above the plane of the substrate surface in response to an activation force, and wherein the lifted optical device is movable relative to the plane of the substrate in response to generation of an electric field between the optical device and the substrate; and
   a stiction force reducing element disposed on the outer edge of said optical element for reducing a contact surface area between said optical device and said substrate.

10. The micro-electro-mechanical optical device of claim 9, wherein said stiction force reducing element comprises a first stiction force reducing element, said device further comprising an inner support member having an edge and disposed between said micro-electro-mechanical structure and said optical element for interfacing sad optical element with said micro-electro-mechanical structure, and a second stiction force reducing element disposed on said edge of said inner support structure for reducing a contact surface area between said inner support structure and said substrate.

11. The micro-electro-mechanical optical device of claim 10, wherein said first and second stiction reducing elements comprise a plurality of spaced-apart protrusions disposed on and outwardly extending from the outer edge of the optical element and the edge of the inner structure, respectively.

* * * * *